United States Patent [19]

Cabot

[11] Patent Number: 5,136,267
[45] Date of Patent: Aug. 4, 1992

[54] TUNABLE BANDPASS FILTER SYSTEM AND FILTERING METHOD

[75] Inventor: Richard C. Cabot, Portland, Oreg.

[73] Assignee: Audio Precision, Inc., Beaverton, Oreg.

[21] Appl. No.: 633,675

[22] Filed: Dec. 26, 1990

[51] Int. Cl.$^5$ .............................................. H03H 7/00
[52] U.S. Cl. ................................... 333/174; 333/17.1; 333/167
[58] Field of Search .................. 333/174, 17.1, 205, 333/207, 209, 176, 167, 126, 175; 331/8, 18, 76

[56] References Cited

U.S. PATENT DOCUMENTS

| | | | |
|---|---|---|---|
| 3,644,847 | 2/1972 | Neuman | 333/17.1 |
| 3,742,395 | 6/1973 | Yoneyama | 333/17.1 |
| 4,545,258 | 10/1985 | Coursolle | 333/17.1 X |
| 5,019,792 | 5/1991 | DiBiase et al. | 333/17.1 |

Primary Examiner—Eugene R. LaRoche
Assistant Examiner—Ali Neyzari
Attorney, Agent, or Firm—William A. Birdwell & Associates

[57] ABSTRACT

A tunable bandpass filter system and filtering method wherein the bandwidth of a tunable bandpass filter is adjusted as a function of the fundamental frequency of an input signal. Either a constant bandwidth or a constant quality factor tunable bandpass filter may be used. The center frequency of the tunable bandpass filter is adjusted in direct proportion to the product of the fundamental frequency and the number of a selected harmonic thereof. In the case of a constant bandwidth filter the bandwidth is adjusted in direct proportion to the quotient of the fundamental frequency divided by a selected filter quality factor. In the case of a constant quality factor filter, the bandwidth is indirectly controlled by adjusting the center frequency while adjusting the quality factor in inverse proportion to the harmonic number. The output amplitude of the filter is measured to determine the amount of distortion in the input signal. The fundamental frequency may be determined by measuring the input signal.

42 Claims, 5 Drawing Sheets

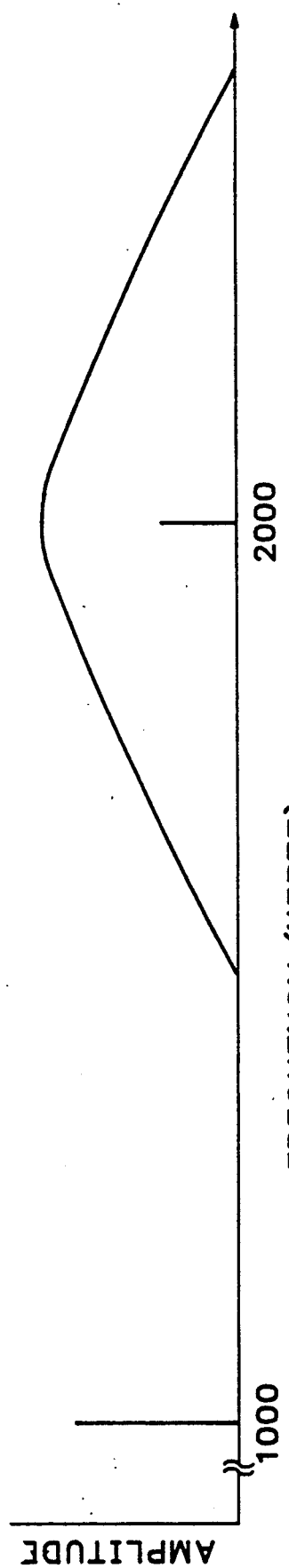
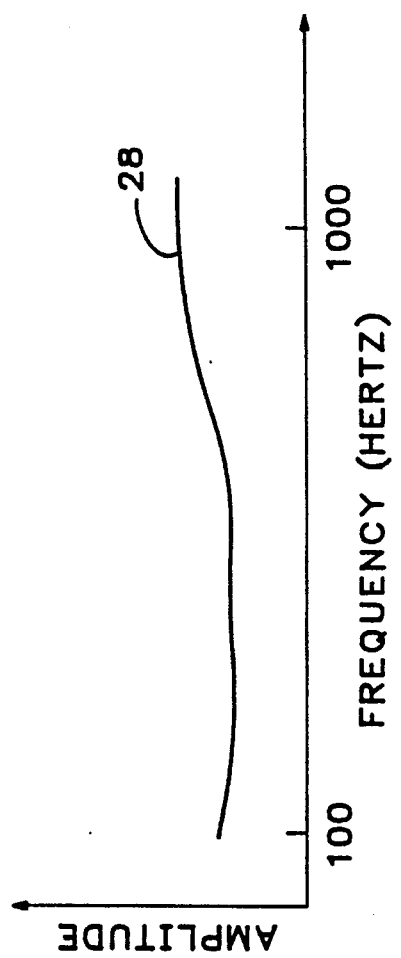
FIG. 4 PRIOR ART
FIG. 5 PRIOR ART

TUNABLE BANDPASS FILTER SYSTEM AND FILTERING METHOD

BACKGROUND OF THE INVENTION

This invention relates to tunable bandpass filter systems and filtering methods, and particularly to the use of a tunable bandpass filter whose bandwidth is adjusted in response to the fundamental frequency of an input signal to a test device to measure audio frequency distortion by determining the amplitude of the harmonics of the fundamental frequency produced by the test device.

Audio signal distortion measurements are often made by applying to a device whose distortion is to be measured a sinusoidal input signal whose frequency is known and determining the amplitude of one or more harmonics of that frequency at the output of the test device. In one distortion measurement the amplitude of a selected harmonic is measured while the frequency of the input signal is swept over a predetermined range. In another distortion measurement the amplitudes of several harmonics of the input signal are measured while the frequency of the input signal is held constant.

A bandpass filter is ordinarily used to make the distortion measurements described above. Bandpass filters generally fall into one of two broad categories: constant bandwidth bandpass filters and constant Q ("quality factor" or "percentage bandwidth") bandpass filters. In the case of a constant bandwidth filter the bandwidth of the filter can be adjusted, but once adjusted, it stays the same regardless of the center frequency, that is, the measurement frequency, to which the filter is tuned. In the case of a constant Q filter, the Q, that is, the ratio of the center frequency of the filter to its bandwidth, can be adjusted and once the Q is adjusted, the Q stays the same regardless of the center frequency to which the filter is tuned.

Where the input signal frequency is to be varied while the amplitude of a selected harmonic is measured, a constant Q filter is ordinarily used. Since the bandwidth of a bandpass filter must be narrow to discriminate between harmonics at low frequencies and since the frequency range to be measured extends over three decades, use of a constant bandwidth filter would make tuning of the center frequency to a selected harmonic of the input signal, or to the harmonic of an input signal whose frequency is unstable, increasingly difficult as the center frequency increases. However, the bandwidth of a constant Q filter increases as its center frequency increases thereby keeping the ability to tune the filter to a given harmonic the same at all center frequencies.

Where the frequency of the input signal is to be held constant while the amplitudes of several harmonics of the input signal are measured, a constant bandwidth filter is ordinarily used. Since harmonics of the input signal are equally spaced, use of a constant Q filter would cause the bandwidth of the filter to overlap more than one harmonic as the center frequency increases, resulting in inaccurate amplitude measurements. However, holding the bandwidth of the filter constant, and less than or equal to the separation of the harmonics, prevents this problem from occurring.

Spectrum analyzers and other signal distortion measurement devices are known which employ either a constant bandwidth or a constant Q bandpass filter, but neither is entirely adequate for the reasons explained above. However, it has been discovered that by constructing a bandpass filter system wherein the filter bandwidth is a function of the fundamental frequency, regardless of whether the filter is of the constant bandwidth or constant Q type, the advantages of both types of previously known filters can be obtained in a single apparatus and method.

In addition to known spectrum analyzers and distortion measurement devices, devices are known which vary their bandwidth to accommodate the spectrum of an input signal, as disclosed by Yoneyama U.S. Pat. No. 3,742,395, and which provide a low-pass filter whose upper frequency cut off tracks the fundamental frequency of an input signal so as to provide a constant amplitude output signal, as disclosed in Neuman U.S. Pat. No. 3,644,847. However, none of these devices provides a solution to the problems discussed above.

SUMMARY OF THE INVENTION

The present invention overcomes the drawbacks of prior art spectrum analyzers and other distortion measurement devices, and takes advantage of the aforementioned discovery, by providing a distortion measurement apparatus and method that employs a tunable bandpass filter system having a bandpass filter whose bandwidth is controlled to be proportional to the fundamental frequency of an input signal, and whose center frequency is controlled to be equal to the product of the input signal fundamental frequency and the harmonic number of the harmonic to be measured. The filter may be of either the constant bandwidth or constant Q type. The input signal frequency is selected, or its fundamental frequency is measured, and the harmonic number of the harmonic whose amplitude is to be measured is selected. A control means adjusts the bandwidth of the bandpass filter, either directly or indirectly depending on the type of filter, so that its bandwidth is proportional to the fundamental frequency of the input signal, regardless of the center frequency or harmonic number. As the fundamental frequency of the input signal changes, the bandwidth of the filter changes to stay proportional to the fundamental frequency.

In a preferred embodiment the input signal is represented digitally, the bandpass filter is a digital filter, and the filter and control system comprise a programmed digital processor. Thence, the center frequency and bandwidth or Q of the filter are set by digital signals (parameters of the digital filter software) produced by the control system software in response to the three selections mentioned above. The center frequency is computed by multiplying the input frequency by the selected harmonic number. The bandwidth of a constant bandwidth filter is computed by multiplying the fundamental frequency of the input signal by a selected filter Q.

In an alternate embodiment the Q of a constant Q filter is computed by multiplying the inverse of the harmonic number by the selected filter Q at the fundamental frequency.

Other embodiments may employ an analog filter or a digital filter, and either analog or digital computational circuitry or software.

Therefore, it is a principal objective of the present invention to provide a new and improved tunable bandpass filter system and filtering method.

It is another objective of the present invention to provide a bandpass filter system and filtering method wherein only the fundamental frequency and the harmonic number need be supplied, regardless of the type of filter employed and of the type of harmonic distortion test, to implement the test.

It is a further objective of the present invention to provide a bandpass filter system whose bandwidth is controlled solely by the fundamental frequency of an input signal, regardless of the type of filter and the center frequency of the filter.

It is yet another objective of the present invention to provide a tunable bandpass filter system for facilitating the measurement of harmonic distortion caused by a test device.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 4 is a graph of signal amplitude as a function of frequency, showing the frequency response of the constant Q filter of FIG. 3 whose center frequency is tuned to the second harmonic of a 1000 Hertz fundamental frequency.

FIG. 5 is a graph of filter output amplitude for a selected harmonic where the harmonic number is held constant and the fundamental frequency is swept across a predetermined range using a constant Q filter.

DETAILED DESCRIPTION OF THE INVENTION

Figure 1:
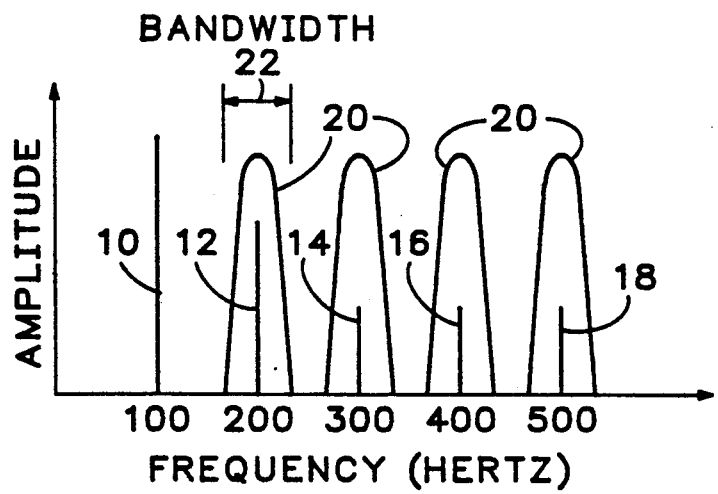
FIG. 1 is a graph of signal amplitude as a function of frequency, showing a fundamental frequency, several harmonics thereof, and the frequency response of a constant bandwidth filter.
Figure 2:
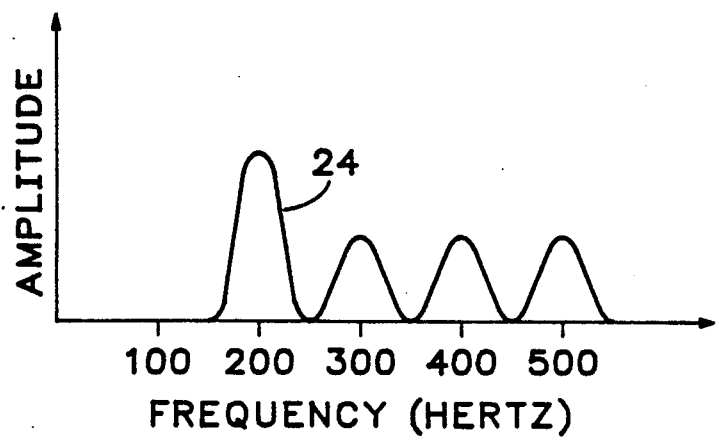
FIG. 2 is a graph of the amplitude of the output of a constant bandwidth filter whose center frequency is swept across the harmonics of the fundamental frequency shown in FIG. 1.

One type of signal distortion measurement often made is illustrated by FIGS. 1 and 2. In that measurement distortion is determined from the amplitudes of a number of harmonics of a fundamental frequency generated by a device under test at the output of that device when the fundamental frequency is applied to the input of the device. FIG. 1 shows the fundamental frequency 10 and its second harmonic 12, its third harmonic 14, its fourth harmonic 16 and its fifth harmonic 18, that is, the harmonics having harmonic numbers 2, 3, 4 and 5, respectively. It also shows the frequency response 20 of a constant bandwidth bandpass filter centered alternatively about each of the harmonics. The filter has a bandwidth less than or equal to the fundamental frequency. The center frequency of the filter is tuned alternatively to each of the harmonic frequencies, resulting in a filter output as shown by FIG. 2. Thence, the filter output shown by the amplitude curve 24 in FIG. 2 is an indication of the amount of harmonic distortion introduced by the test device.

Figure 3:
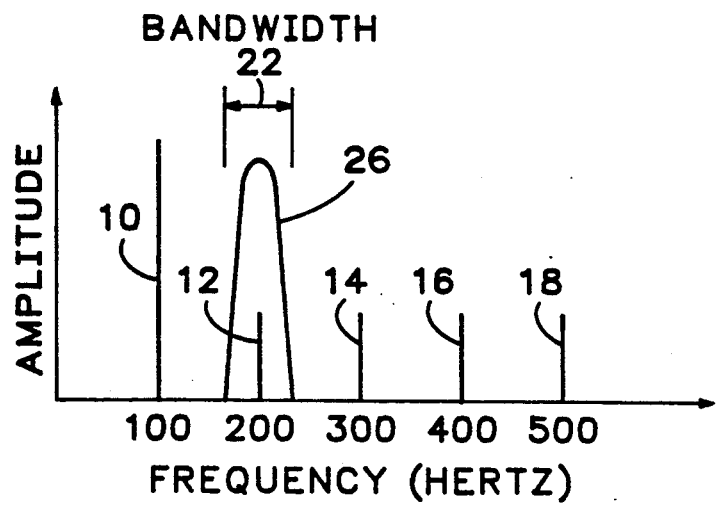
FIG. 3 is a graph of signal amplitude as a function of frequency, showing the frequency response of a constant Q filter whose center frequency is tuned to the second harmonic of a 100 Hertz fundamental frequency.

Another type of signal distortion measurement often made is illustrated by FIGS. 3, 4 and 5. In that measurement, distortion at a selected harmonic of the fundamental frequency is determined from the amplitude of that harmonic as the fundamental frequency is swept across a predetermined range Like FIG. 1, FIG. 3 shows the fundamental frequency 10 and its second through fifth harmonics. It also shows the frequency response 26 of a constant Q bandpass filter. The center frequency of the filter is tuned to a selected harmonic number, in this case the second harmonic 12, of the fundamental frequency, and the bandwidth is adjusted to be less than or equal to the fundamental frequency. When the fundamental frequency is changed and the center frequency of the bandpass filter is tuned to the new second harmonic, as shown by FIG. 4, the bandwidth of the filter increases in proportion to the fundamental frequency in order to maintain a constant Q. The second harmonic amplitude curve 28 in FIG. 5, where the fundamental frequency has been swept over a range of 100 Hertz through 1000 Hertz, is another indication of harmonic distortion produced by the test device.

Figure 6:
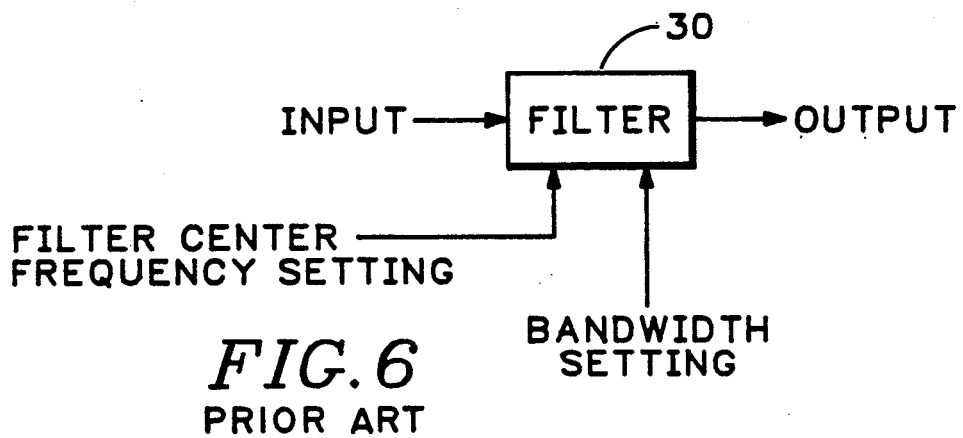
FIG. 6 is an illustration of a constant bandwidth filter.

FIG. 6 illustrates a conventional constant bandwidth filter 30, as is ordinarily used to perform the test shown by FIGS. 1 and 2. In that filter there is a setting for the center frequency and a setting for the bandwidth. They are independent, so that when the center frequency is changed the bandwidth stays constant, and vice versa. Typically, such a filter has a dial for setting the center frequency and a dial or selector switch for setting the bandwidth, though these settings may be accomplished in any number of ways, including the application of electrical setting input signals, as indicated by FIG. 6.

Figure 7:
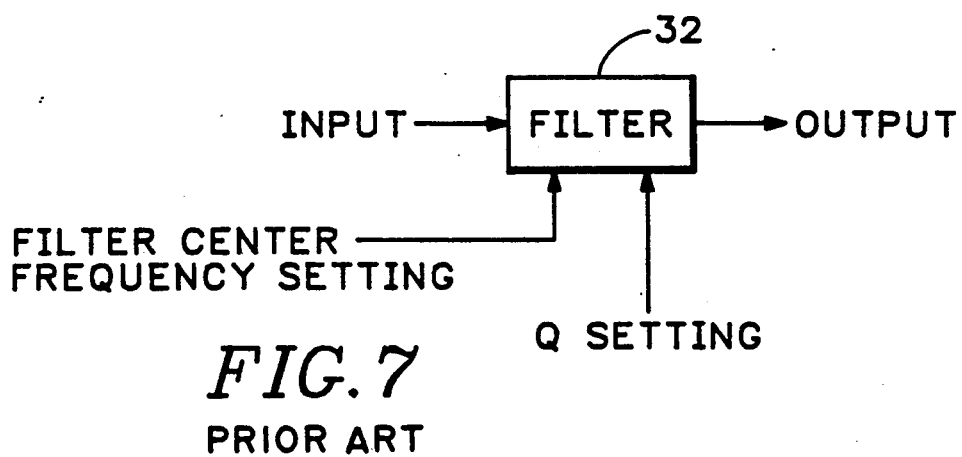
FIG. 7 is an illustration of a constant Q filter.

FIG. 7 illustrates a conventional constant Q filter 32, as is ordinarily used to perform the test shown by FIGS. 3, 4 and 5. In that filter there is a setting for the center frequency and a setting for the quality factor, Q. They are independent so that when the center frequency is changed the Q stays constant, and vice versa. Consequently, when the center frequency is changed the bandwidth must change, due to an internal mechanism of the filter, in order to maintain constant Q. Like the constant bandwidth filter, this filter typically has a dial for setting the center frequency and a dial or selector switch for setting the Q, though these settings may also be accomplished in any number of ways, including the application of electrical setting input signals, as indicated by FIG. 7.

Figure 8:
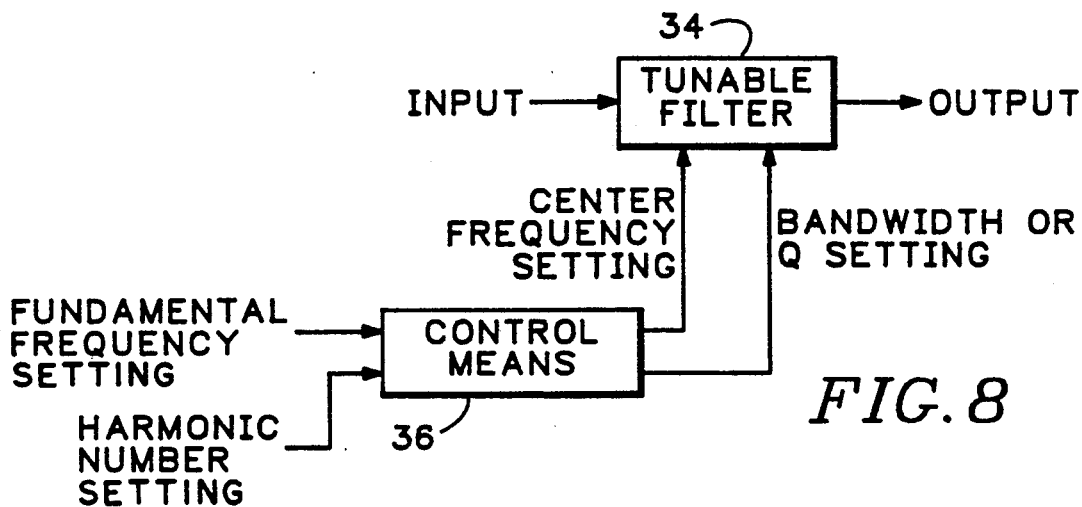
FIG. 8 is an illustration of a tunable filter system according to the present invention.

Turning now to FIG. 8, the invention comprises a tunable bandpass filter 34 and an associated control means 36. In the preferred embodiment the tunable bandpass filter is a digital filter and the control means is also digital, though it is to be recognized that an analog filter and an analog control means could be used without departing from the principles of the invention. Also, preferably, the digital filter and its control means are constructed by programming a digital processor, as is commonly understood in the art of digital signal processing, though it is to be recognized that a hard wired or special purpose processor may be used without departing from the principles of the invention. In general, the architecture of the digital filter is such that the center frequency and the bandwidth are controllable. In the simplest form the architecture would ordinarily be of the constant bandwidth type, wherein the bandwidth is controlled by direct adjustment. However, the architecture may also be of the constant Q type, wherein the bandwidth is indirectly controlled by the Q and center frequency adjustments, the Q being the ratio of the filter center frequency to the filter bandwidth.

The control means 36 receives a fundamental frequency setting and a harmonic number setting. Using these two settings it provides, as an output to the tunable filter 34, a center frequency setting. The center frequency setting is proportional, in fact typically equal, to the product of the center frequency and the harmonic number. Using just the fundamental frequency setting, it adjusts the bandwidth of the tunable filter.

To accomplish the bandwidth adjustment if the filter is of the constant Q type, the control means provides both the center frequency setting and a Q setting to the filter, which inherently determines the bandwidth. While the center frequency and the Q both depend on the harmonic number setting, the bandwidth becomes independent of the harmonic number and proportional to the fundamental frequency. This is because the Q setting is inversely proportional to the harmonic number, while the fundamental frequency is directly proportional to the center frequency, thereby cancelling out any effect of the harmonic number on the filter bandwidth. To effect these settings, the control means 36 computes the product of the fundamental frequency and the harmonic number to arrive at the center frequency setting, and computes the product of the desired filter Q at the fundamental frequency and the inverse of the harmonic number setting to arrive at the Q setting.

Figure 9:
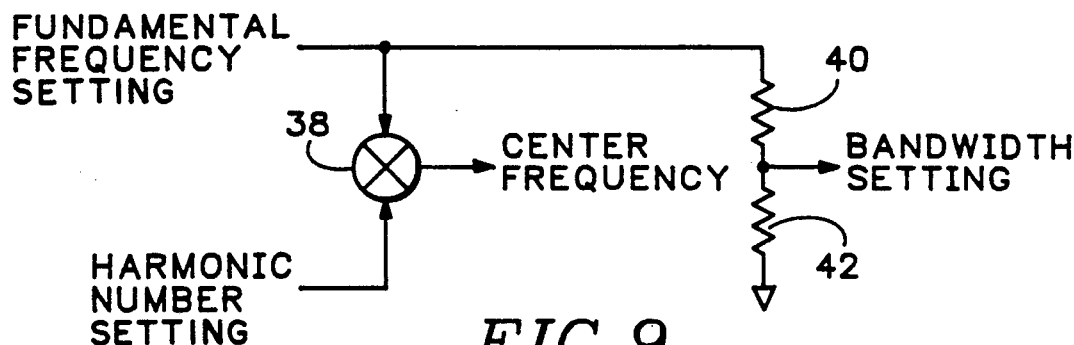
FIG. 9 is an illustration of the control means for a tunable constant Q filter system according to the present invention.
Figure 10:
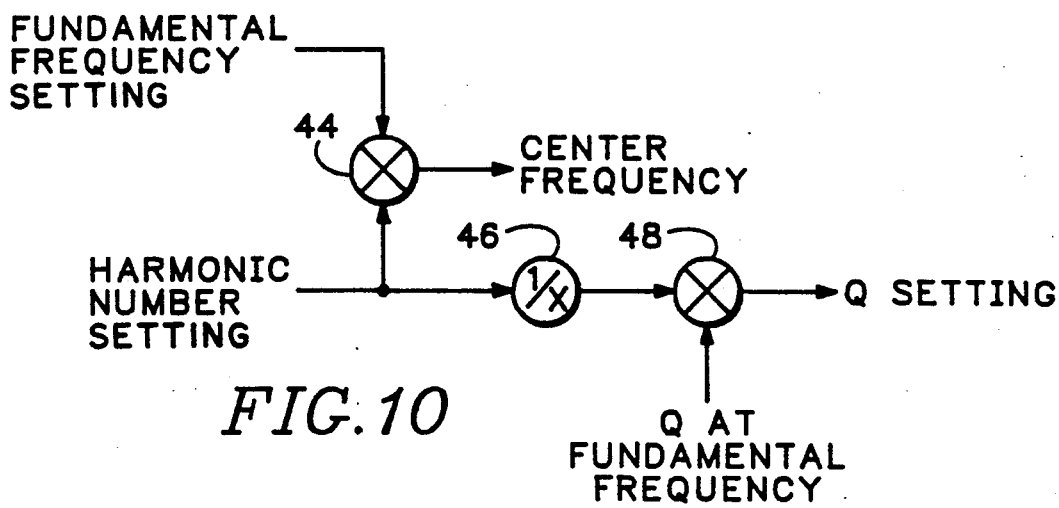
FIG. 10 is an illustration of the control means for a tunable constant bandwidth filter system according to the present invention.

FIGS. 9 and 10 illustrate control means for a constant Q and a constant bandwidth bandpass filter, respectively. In FIG. 9, the fundamental frequency setting is multiplied by the harmonic number setting in multiplier 38, and the product thereof is applied to the center frequency setting of a constant bandwidth filter. The fundamental frequency setting is also applied to a proportionality means, represented by resistors 40 and 42, to produce the bandwidth setting. Thence, the bandwidth setting is independent of the harmonic number setting. In FIG. 10, the fundamental frequency and the harmonic number are applied to multiplier 44 to produce the center frequency setting, as in FIG. 9. However, the harmonic number is reciprocated by divider 46 and multiplied by the desired filter Q at the fundamental frequency by multiplier 48 to arrive at the Q setting. Consequently, when the center frequency setting and the Q setting are applied to a constant Q filter, the bandwidth is determined only by the fundamental frequency, independent of harmonic number and center frequency. It is to be recognized that the control means illustrated by FIGS. 9 and 10 may be implemented in either analog or digital form without departing from the principles of the invention.

Accordingly, it can be seen that, while prior art devices require the operator to know whether the bandpass filter is a constant bandwidth or a constant Q filter; to compute the center frequency and bandwidth or Q settings based on that information, on the fundamental frequency and the harmonic number; and to apply those settings manually to the filter, that is not required by the present invention. In the present invention the nature of the bandpass filter is invisible to the operator, and the operator need only supply the fundamental frequency and harmonic number settings, regardless of the type of distortion test that is to be run.

Figure 11:
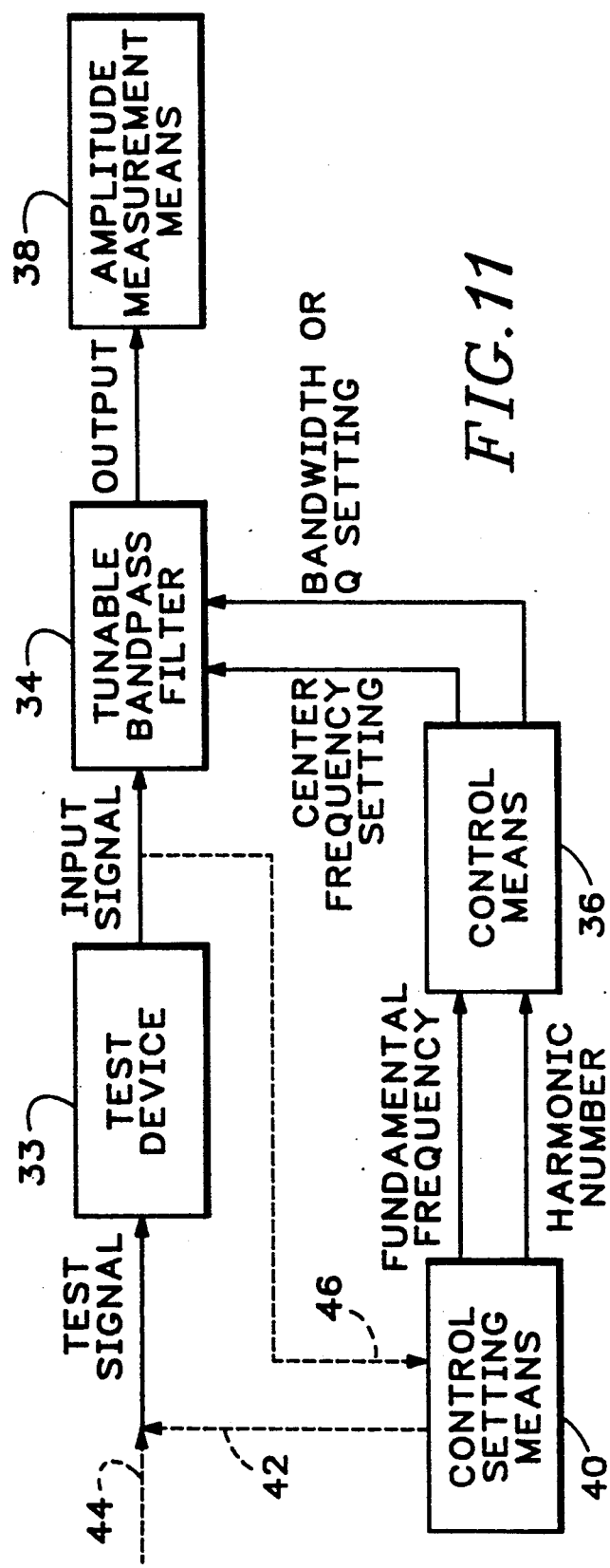
FIG. 11 is an illustration of a distortion measurement system employing a tunable bandpass filter system according to the present invention.

A tunable bandpass filter system according to the present invention may be used to measure distortion in an audio signal as shown, for example, by FIG. 11. A test signal, comprising a sine wave, is applied to a test device 33, whose output supplies the input signal to the bandpass filter 34. The output of the bandpass filter 34 is applied to a signal amplitude measurement means 38, such as a voltmeter, a cathode ray tube display, or digital signal processor. The output amplitude may be measured for each of several selected harmonics while the fundamental frequency is maintained constant, thereby producing data for a graph such as FIG. 2. Alternatively, the output amplitude of a selected harmonic number may be measured while the fundamental frequency is swept through a predetermined range, thereby producing data for a graph such as FIG. 5.

In either case, the fundamental frequency and harmonic number may be selected, or the fundamental frequency may be measured and the harmonic number selected, by a control setting means 40. The control setting means may comprise, for example, manual controls for providing to the test device 33 a test signal having a known fundamental frequency, as shown by line 42, for providing that fundamental frequency and to control means 36, and for selecting a harmonic number and providing it to control means 36. Alternatively, the control setting means may comprise a device for determining the fundamental frequency of the input signal and the test signal may be provided by a separate source to the filter 34, as indicated by line 44. In this case the fundamental frequency of the input signal to the bandpass filter 34 is measured by the control setting means 40, as indicated by line 46. In practice, the test signal may be provided by an analog or digital sine wave source combined with the tunable bandpass filter, the control means, the control setting means and the amplitude measurement means in a single instrument.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A bandpass filter system for operating on an input signal having a fundamental frequency, said system comprising:
    (a) a tunable bandpass filter having a center frequency which is adjustable separately from said fundamental frequency and a bandwidth which is controllable; and
    (b) bandwidth tuning means for controlling said bandwidth as a function of said fundamental frequency and said center frequency.

2. The filter system of claim 1 wherein said bandwidth tuning means includes means for causing said bandwidth to be proportional to said fundamental frequency.

3. The filter system of claim 1 wherein said bandwidth tuning means includes means for determining said fundamental frequency by measuring said input signal.

4. The filter system of claim 1 wherein said bandpass filter comprises a constant bandwidth filter, and said bandwidth tuning means includes means for computing the quotient of said fundamental frequency divided by a selected bandpass filter quality factor to adjust said filter bandwidth.

5. The filter system of claim 1 wherein said bandpass filter has a center frequency that is adjustable, said system further comprising center frequency tuning means for adjusting said center frequency as a function of said fundamental frequency and the number of a selected harmonic of said fundamental frequency.

6. The filter system of claim 5 wherein said bandwidth tuning means includes means for causing said center frequency to be proportional to the product of said fundamental frequency and said harmonic number.

7. The filter system of claim 1 wherein said bandpass filter comprises a constant quality factor filter whose center frequency is adjustable, said bandwidth being controlled by adjusting said center frequency.

8. The filter system of claim 7 wherein said quality factor of said bandpass filter is adjustable, said system further comprising harmonic number tuning means for adjusting said quality factor in inverse proportion to the number of a selected harmonic of said fundamental frequency and adjusting said center frequency in direct proportion to said harmonic number.

9. The filter system of claim 8 wherein said harmonic number tuning means includes multiplier means for computing the product of said fundamental frequency and said harmonic number to adjust said center frequency.

10. The filter system of any of claims 1 through 9 wherein said bandpass filter comprises an analog filter.

11. The filter system of any of claims 1 through 9 wherein said bandpass filter comprises a digital filter.

12. The filter system of any of claims 1 through 9 wherein at least one said tuning means comprises analog computational circuitry.

13. The filter system of any of claims 1 through 9 wherein at least one said tuning means comprises digital computational means.

14. The filter system of claim 1 wherein said bandpass filter produces a filtered output signal, said system further comprising means for measuring the amplitude of said output signal to determine the amount of distortion in said input signal 15. The filter system of claim 14 wherein said bandpass filter comprises a constant bandwidth filter that has a center frequency that is adjustable, said bandwidth tuning means includes means for computing the quotient of said fundamental frequency divided by a selected bandpass filter quality factor and adjusting said filter bandwidth to be proportional to said quotient, and center frequency tuning means for adjusting said center frequency to be proportional to the product of said fundamental frequency and the number of a selected harmonic of said fundamental frequency.

16. The filter system of claim 14 wherein said bandpass filter comprises a constant quality factor filter whose center frequency is adjustable, harmonic number tuning means for adjusting said quality factor in inverse proportion to the number of a selected harmonic of said fundamental frequency, and center frequency tuning means for adjusting said center frequency to be proportional to the product of said fundamental frequency and said harmonic number.

17. The filter system of either of claims 15 or 16 further comprising means for measuring the fundamental frequency of said input signal and providing said fundamental frequency to said control means.

18. A method for filtering a signal having a fundamental frequency, comprising the steps of:
 (a) applying said signal as an input signal to a tunable bandpass filter having a center frequency which is adjustable separately from said fundamental frequency and a bandwidth which controllable; and
 (b) controlling said bandwidth as a function of said fundamental frequency and said center frequency.

19. The method of claim 18 wherein said controlling step comprises causing said bandwidth to be proportional to said fundamental frequency.

20. The method of claim 18 further comprising determining said fundamental frequency by measuring said input signal.

21. The method of claim 18 wherein said bandpass filter comprises a constant bandwidth filter, said method further comprising computing the quotient of said fundamental frequency divided by a selected bandpass filter quality factor to adjust said filter bandwidth.

22. The method of claim 18 wherein said bandpass filter has a center frequency that is adjustable, said method further comprising adjusting said center frequency as a function of said fundamental frequency and the number of a selected harmonic of said fundamental frequency.

23. The method of claim 22 wherein said controlling step comprises causing said center frequency to be proportional to the product of said fundamental frequency and said harmonic number.

24. The method of claim 18 wherein said bandpass filter comprises a constant quality factor filter whose center frequency is adjustable, said method further comprising controlling said bandwidth by adjusting said center frequency as a function of said fundamental frequency.

25. The method of claim 24 wherein said quality factor of said bandpass filter is adjustable, said method further comprising adjusting said quality factor in inverse proportion to the number of a selected harmonic of said fundamental frequency and adjusting said center frequency in direct proportion to said harmonic number.

26. The method of claim 25 further comprising computing the product of said fundamental frequency and said harmonic number to adjust said center frequency to be proportional to said product.

27. The method of claim 18 wherein said bandpass filter produces a filtered output signal, said method further comprising measuring the amplitude of said output signal to determine the amount of distortion in said input signal.

28. The method of claim 27 wherein said bandpass filter comprises a constant bandwidth filter that has a center frequency that is adjustable, said method further comprising computing the quotient of said fundamental frequency divided by a selected bandpass filter quality factor, adjusting said filter bandwidth to be proportional to said quotient, and adjusting said center frequency to be proportional to the product of said fundamental frequency and the number of a selected harmonic of said fundamental frequency.

29. The method of claim 27 wherein said bandpass filter comprises a constant quality factor filter whose center frequency is adjustable, said method further comprising adjusting said quality factor in inverse proportion to said harmonic number and adjusting said center frequency to be proportional to the product of said fundamental frequency and the number of a selected harmonic of said fundamental frequency.

30. The method of either of claims 28 or 29 further comprising measuring the fundamental frequency of said input signal.

31. A bandpass filter system for operating on an input signal having a fundamental frequency, said system comprising:
   (a) a tunable bandpass filter whose bandwidth is controllable, said bandpass filter comprising a constant quality factor filter whose quality factor and center frequency are adjustable, said bandwidth being controlled by adjusting said center frequency;
   (b) bandwidth tuning means for controlling said bandwidth as a function of said fundamental frequency; and
   (c) harmonic number tuning means for adjusting said quality factor in inverse proportion to the number of a selected harmonic of said fundamental frequency and adjusting said center frequency in direct proportion to said harmonic number.

32. The filter system of claim 31 wherein said harmonic number tuning means includes multiplier means for computing the product of said fundamental frequency and said harmonic number to adjust said center frequency.

33. A bandpass filter system for operating on an input signal having a fundamental frequency, said system comprising:
   (a) a tunable constant bandwidth bandpass filter whose center frequency is adjustable, whose bandwidth is controllable and which produces a filtered output signal;
   (b) bandwidth tuning means for controlling said bandwidth as a function of said fundamental frequency, said bandwidth tuning means including means for computing the quotient of said fundamental frequency divided by a selected bandpass filter quality factor and adjusting said filter bandwidth to be proportional to said quotient, and center frequency tuning means for adjusting said center frequency to be proportional to the product of said fundamental frequency and the number of a selected harmonic of said fundamental frequency; and
   (c) means for measuring the amplitude of said output signal to determine the amount of distortion in said input signal.

34. The filter system of claim 33, further comprising means for measuring the fundamental frequency of said input signal and providing said fundamental frequency to said control means.

35. A bandpass filter system for operating on an input signal having a fundamental frequency, said system comprising:
   (a) a tunable constant quality factor bandpass filter whose center frequency is adjustable, whose bandwidth is controllable and which produces a filtered output signal;
   (b) bandwidth tuning means for controlling said bandwidth as a function of said fundamental frequency;
   (c) harmonic number tuning means for adjusting said quality factor in inverse proportion to the number of a selected harmonic of said fundamental frequency;
   (d) center frequency tuning means for adjusting said center frequency to be proportional to the product of said fundamental frequency and said harmonic number; and
   (e) means for measuring the amplitude of said output signal to determine the amount of distortion in said input signal.

36. The filter system of claim 35, further comprising means for measuring the fundamental frequency of said input signal and providing said fundamental frequency to said control means.

37. A method for filtering a signal having a fundamental frequency, comprising the steps of:
   (a) applying said signal as an input signal to a constant quality factor tunable bandpass filter whose center frequency is adjustable, whose quality factor is adjustable and whose bandwidth is controllable;
   (b) controlling said bandwidth by adjusting said center frequency as a function of said fundamental frequency; and
   (c) adjusting said quality factor in inverse proportion to the number of a selected harmonic of said fundamental frequency; and
   (d) adjusting said center frequency in direct proportion to said harmonic number.

38. The method of claim 37, further comprising computing the product of said fundamental frequency and said harmonic number to adjust said center frequency to be proportional to said product.

39. A method for filtering a signal having a fundamental frequency, comprising the steps of:
   (a) applying said signal as an input to a constant bandwidth tunable bandpass filter whose center frequency is adjustable, whose bandwidth is controllable and which produces a filtered output signal;
   (b) controlling said bandwidth as a function of said fundamental frequency by computing the quotient of said fundamental frequency divided by selected bandpass filter quality factor, adjusting said filter bandwidth to be proportional to said quotient, and adjusting said center frequency to be proportional to the product of said fundamental frequency and the number of a selected harmonic of said fundamental frequency; and
   (c) measuring the amplitude of said output signal to determine the amount of distortion in said input signal.

40. The method of claim 39, further comprising measuring the fundamental frequency of said input signal to determine the same.

41. A method for filtering a signal having a fundamental frequency, comprising the steps of:
   (a) applying said signal as an input signal to a constant quality factor tunable bandpass filter whose center frequency is adjustable, whose bandwidth is controllable and which produces a filtered output signal;
   (b) controlling said bandwidth as a function of said fundamental frequency by adjusting said quality factor in inverse proportion to said harmonic number and adjusting said center frequency to be proportional to the product of said fundamental frequency and the number of a selected harmonic of said fundamental frequency; and
   (c) measuring the amplitude of said output signal to determine the amount of distortion in said input signal.

42. The method of claim 41, further comprising measuring the fundamental frequency of said input signal to determine the same.

* * * * *